(12) United States Patent
Mataya

(10) Patent No.: US 10,223,316 B2
(45) Date of Patent: Mar. 5, 2019

(54) INTERFACE COMPATIBLE WITH M.2 CONNECTOR SOCKET FOR ULTRA HIGH CAPACITY SOLID STATE DRIVE

(71) Applicant: NGD SYSTEMS, INC., Irvine, CA (US)

(72) Inventor: Richard Mataya, Rancho Santa Margarita, CA (US)

(73) Assignee: NGD Systems, Inc., Irvine, CA (US)

( * ) Notice: Subject to any disclaimer, the term of this patent is extended or adjusted under 35 U.S.C. 154(b) by 280 days.

(21) Appl. No.: 15/195,912

(22) Filed: Jun. 28, 2016

(65) Prior Publication Data

US 2016/0306768 A1    Oct. 20, 2016

Related U.S. Application Data

(63) Continuation-in-part of application No. 14/741,921, filed on Jun. 17, 2015, now abandoned.

(Continued)

(51) Int. Cl.

| G06F 13/00 | (2006.01) |
|---|---|
| G06F 13/40 | (2006.01) |
| G06F 13/42 | (2006.01) |
| G11C 16/10 | (2006.01) |
| G11C 16/26 | (2006.01) |
| G11C 29/04 | (2006.01) |

(Continued)

(52) U.S. Cl.
CPC ...... G06F 13/4068 (2013.01); G06F 13/4022 (2013.01); G06F 13/4282 (2013.01); G11C 16/10 (2013.01); G11C 16/26 (2013.01); G11C 29/04 (2013.01); G11C 29/44 (2013.01); G11C 29/4401 (2013.01); G11C 29/765 (2013.01); G06F 2213/0026 (2013.01); G06F 2213/0032 (2013.01); G06F 2213/0036 (2013.01); G06F 2213/0042 (2013.01); G11C 16/00 (2013.01); G11C 2029/0401 (2013.01); G11C 2029/0409 (2013.01); Y02D 10/14 (2018.01); Y02D 10/151 (2018.01)

(58) Field of Classification Search
CPC .................................................. G06F 13/4068
See application file for complete search history.

(56) References Cited

U.S. PATENT DOCUMENTS

| 9,552,316 B2 * | 1/2017 | Desimone ............. G06F 9/4411 |
| 9,619,164 B2 * | 4/2017 | Mehta ................... G06F 3/0626 |

(Continued)

*Primary Examiner* — Tammara R Peyton
(74) *Attorney, Agent, or Firm* — Lewis Roca Rothgerber Christie LLP

(57) ABSTRACT

A solid state drive with modular memory. The solid state drive may include a modular array of memory cards installed on a controller board, each memory card being connected to the controller board utilizing a respective connector. Redundant data, e.g., parity data, may be stored in the solid state drive, making it possible for a solid state drive controller on the controller board to restore the contents of a removed memory card (e.g., a memory card that has failed) on a replacement memory card installed in its place. The connector utilized to connect each memory card to the controller board may be an industry standard, commercial off the shelf connector, e.g., an M.2 connector; the functions of the conductors in the connector may be redefined, from the industry standard definitions, for the purposes of embodiments of the present invention.

6 Claims, 12 Drawing Sheets

Related U.S. Application Data

(60) Provisional application No. 62/013,903, filed on Jun. 18, 2014.

(51) Int. Cl.
*G11C 29/44* (2006.01)
*G11C 29/00* (2006.01)
G11C 16/00 (2006.01)

(56) References Cited

U.S. PATENT DOCUMENTS

| | | | |
|---|---|---|---|
| 10,067,844 B2 * | 9/2018 | Lu | G06F 11/2094 |
| 2009/0063895 A1 | 3/2009 | Smith | |
| 2014/0365699 A1 * | 12/2014 | Barga | G06F 13/409 710/301 |
| 2015/0277512 A1 * | 10/2015 | Davis | G06F 1/183 361/679.31 |
| 2016/0154762 A1 * | 6/2016 | He | G06F 13/4282 710/301 |

* cited by examiner

FIG. 5A

Connector 510:

| Pin | Signal | Voltage |
|---|---|---|
| 38 | DEVSLP (O) | |
| 36 | N/C | |
| 34 | N/C | |
| 32 | N/C | |
| 30 | N/C | |
| 28 | N/C | |
| 26 | N/C | |
| 24 | N/C | |
| 22 | N/C | |
| 20 | N/C | |
| 18 | 3.3V | |
| 16 | 3.3V | |
| 14 | 3.3V | |
| 12 | 3.3V | |
| 10 | LED1# (I/O) | |
| 8 | N/C | |
| 6 | N/C | |
| 4 | 3.3V | |
| 2 | 3.3V | |

Signal names (pin 38 → 2): ALE0, WE0#, RE0#_T, RE0#_C, RDY/BSY0#, CLE1, ALE1, WE1#, RE1#_T, RE1#_C, VPP (12V), VPP (12V), VCCQ (1.8V), VCCQ (1.8V), LED/MODE2, RDY/BSY1#, WP#, VCCQ (1.8V), VCCQ (1.8V)

Connector 525:

| Pin | Signal |
|---|---|
| 37 | PETp1 |
| 35 | PETn1 |
| 33 | GND |
| 31 | PERp1 |
| 29 | PERn1 |
| 27 | GND |
| 25 | PETp2 |
| 23 | PETn2 |
| 21 | GND |
| 19 | PERp2 |
| 17 | PERn2 |
| 15 | GND |
| 14 | PETp3 |
| 11 | PETn3 |
| 9 | GND |
| 7 | PERp3 |
| 5 | PERn3 |
| 3 | GND |
| 1 | GND |

Connector 515:

| Signal |
|---|
| DQ0_1 |
| DQ0_0 |
| GND |
| DQS1_C |
| DQS1_T |
| GND |
| DQ1_7 |
| DQ1_6 |
| GND |
| DQ1_5 |
| DQ1_4 |
| GND |
| DQ1_3 |
| DQ1_2 |
| GND |
| DQ1_1 |
| DQ1_0 |
| GND |
| GND |

| | Channel 0 | Channel 1 | Channel 2 | | Channel 13 | Channel 14 | Channel 15 | |
|---|---|---|---|---|---|---|---|---|
| Super Page 0 | Page 0 | Page 0 | Page 0 | | Page 0 | Page 0 | Page 0 | |
| Super Page 1 | Page 1 | Page 1 | Page 1 | | Page 1 | Page 1 | Page 1 | Super Block |
| Super Page 2 | Page 2 | Page 2 | Page 2 | | Page 2 | Page 2 | Page 2 | |
| Super Page 3 | Page 3 | Page 3 | Page 3 | | Page 3 | Page 3 | Page 3 | |
| | ☐☐☐ | ☐☐☐ | ☐☐☐ | ☐☐☐ | ☐☐☐ | ☐☐☐ | ☐☐☐ | |
| Super Page n-2 | Page n-2 | Page n-2 | Page n-2 | | Page n-2 | Page n-2 | Page n-2 | |
| Super Page n-1 | Page n-1 | Page n-1 | Page n-1 | | Page n-1 | Page n-1 | Page n-1 | |
| Super Page n | Page n | Page n | Page n | | Page n | Page n | Page n | |

INTERFACE COMPATIBLE WITH M.2 CONNECTOR SOCKET FOR ULTRA HIGH CAPACITY SOLID STATE DRIVE

CROSS-REFERENCE TO RELATED APPLICATION(S)

The present application is a continuation-in-part of U.S. patent application Ser. No. 14/741,921, filed Jun. 17, 2015, entitled "ULTRA HIGH CAPACITY SSD", which claims priority to and the benefit of U.S. Provisional Application No. 62/013,903, filed Jun. 18, 2014, entitled "ULTRA HIGH CAPACITY SSD", the entire contents of both of which are incorporated herein by reference.

FIELD

One or more aspects of embodiments according to the present invention relate to solid state drives, and more particularly to a modular design for a solid state drive.

BACKGROUND

Related art solid state drives may include a controller and a plurality of memory chips or package on a printed circuit board. For a high-capacity solid state drive, the total cost of the memory may be significant. As such, if an entire solid state drive must be scrapped when a single defective memory package is installed on the printed circuit board, or when a single memory package fails in operation, the cost of such a defect or failure may be great.

Thus, there is a need for an improved design for a solid state drive.

SUMMARY

Aspects of embodiments of the present disclosure are directed toward a solid state drive with modular memory. The solid state drive may include a modular array of memory cards installed on a controller board, each memory card being connected to the controller board utilizing a respective connector. The memory cards may be individually tested during manufacturing, prior to assembly of the solid state drive, and the memory cards may be individually replaceable in case of failure. Redundant data, e.g., parity data, may be stored in the solid state drive, making it possible for a solid state drive controller on the controller board to restore the contents of a removed memory card (e.g., a memory card that has failed) on a replacement memory card installed in its place. The connector utilized to connect each memory card to the controller board may be an industry standard, commercial off the shelf connector, e.g., an M.2 connector; the functions of the conductors in the connector may be redefined, from the industry standard definitions, for the purposes of embodiments of the present invention.

According to an embodiment of the present invention there is provided a solid state drive, including: a controller board, including a plurality of card-edge connector sockets; and a plurality of memory cards on the controller board, a first memory card of the plurality of memory cards including: a memory package including a flash memory die; and a first card-edge connector plug, the first card-edge connector plug being coupled to a first connector socket of the plurality of card-edge connector sockets.

In one embodiment, the first connector socket is an M.2 connector socket having a plurality of pins.

In one embodiment, the controller board is configured to supply, through a first pin of the M.2 connector socket, a voltage of at most 3.3 V, with respect to a ground at a second pin, the first pin being selected from the group of pins consisting of pins 2, 4, 12, 14, 16, 18, 70, 72, and 74 of the M.2 connector socket, and the second pin being selected from the group of pins consisting of pins 1, 3, 9, 15, 21, 27, 33, 39, 45, 51, 57, 71, 73, and 75 of the M.2 connector socket.

In one embodiment, the controller board is configured to supply, through the first pin, a voltage of 1.8 V.

In one embodiment, the controller board is further configured: to determine whether a device capable of tolerating a voltage of 12 V, with respect to the ground at the second pin, at a third pin is connected to the M.2 connector socket, and to supply a voltage of 12 V through the third pin when a device capable of tolerating a voltage of 12 V at a third pin is connected to the M.2 connector socket, the third pin being different from the first pin, and the third pin being selected from the group of pins consisting of pins 2, 4, 12, 14, 16, 18, 70, 72, and 74 of the M.2 connector socket.

In one embodiment, the controller board is configured to provide and/or receive, at a plurality of first bus pins of the pins of the M.2 connector socket, a plurality of signals compliant with an Open NAND Flash Interface (ONFI) standard or with a Toggle standard.

In one embodiment, the signals include: an address latch enable signal; a command latch enable signal; a differential pair of read enable signals; a write enable signal; a differential pair of data strobe signals; and eight input-output port bit signals.

In one embodiment, the controller board is configured to provide and/or receive the signals of the differential pair of read enable signals on a pair of adjacent pins of the M.2 connector socket, and the controller board is configured to provide and/or receive the signals of the differential pair of data strobe signals on a pair of adjacent pins of the M.2 connector socket.

In one embodiment, the controller board further includes a solid state drive controller, the solid state drive controller being a processing circuit and having a first flash channel interface, and configured to provide and/or receive, at a plurality of first flash channel pins of the solid state drive controller, a plurality of signals compliant with an Open NAND Flash Interface (ONFI) standard or with a Toggle standard.

In one embodiment, the controller board further includes an analog switch configured to selectively connect the first flash channel pins: to the first bus pins of the M.2 connector socket, or to a plurality of second bus pins of the pins of the M.2 connector socket.

In one embodiment, the solid includes a solid state drive controller on the controller board, the solid state drive controller being configured to communicate with the first memory card only through the M.2 connector socket and to provide and/or receive, at a plurality of first bus pins of the pins of the M.2 connector socket, a plurality of signals compliant with an Open NAND Flash Interface (ONFI) standard or with a Toggle standard, wherein the signals include: an address latch enable signal; a command latch enable signal; a differential pair of read enable signals; a write enable signal; a differential pair of data strobe signals; and eight input-output port bit signals.

In one embodiment, the solid state drive includes a host interface configured to connect the solid state drive to a host computer, the host interface being selected from the group consisting of Serial Advanced Technology Attachment (SATA), Fibre Channel, Small Computer System Interface (SCSI), Serial Attached SCSI (SAS), Peripheral Component Interconnect Express (PCIe), Non Volatile Memory Express (NVMe), SCSI over PCIe, Ethernet, and Universal Serial Bus (USB).

In one embodiment, the host interface is selected from the group consisting of Serial Advanced Technology Attachment (SATA), Fibre Channel, Small Computer System Interface (SCSI), Serial Attached SCSI (SAS), Peripheral Component Interconnect Express (PCIe), Non Volatile Memory Express (NVMe), and SCSI over PCIe.

In one embodiment, the plurality of memory cards includes sixteen memory cards.

In one embodiment, each of the plurality of memory cards includes 64 flash memory die.

According to an embodiment of the present invention there is provided a method of manufacturing a solid state drive, the method including: fabricating a controller board including a plurality of card-edge connector sockets; testing the controller board; fabricating a memory card including a card-edge connector plug; testing the memory card; and installing the memory card on the controller board when: the testing of the controller board was successful, and the testing of the memory card was successful.

In one embodiment, the method includes: testing the controller board with the installed memory card.

According to an embodiment of the present invention there is provided a method of operating and servicing a solid state drive including a plurality of memory cards installed on a controller board, the method including: detecting, by the controller board, a failure on a first memory card of the plurality of memory cards, removing the first memory card from the solid state drive; and installing a second memory card in the place of the first memory card.

In one embodiment, the method includes: illuminating, by the controller board, a light emitting diode on the controller board to identify the first memory card; and powering down the solid state drive before, and powering up the solid state drive after: the removing of the first memory card from the solid state drive; and the installing of the second memory card in the place of the first memory card.

In one embodiment, the method includes: reconstructing, from data stored on other memory cards of the plurality of memory cards, data that were stored on the first memory card prior to the failure storing, on the second memory card, the reconstructed data.

BRIEF DESCRIPTION OF THE DRAWINGS

These and other features and advantages of the present invention will be appreciated and understood with reference to the specification, claims, and appended drawings wherein:

FIG. 5A is a pinout diagram of a first portion of a connector, according to an embodiment of the present invention;

FIG. 7A is a memory layout diagram for a solid state drive, according to an embodiment of the present invention;

DETAILED DESCRIPTION

The detailed description set forth below in connection with the appended drawings is intended as a description of exemplary embodiments of an ultra high capacity solid state drive provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Figure 1:
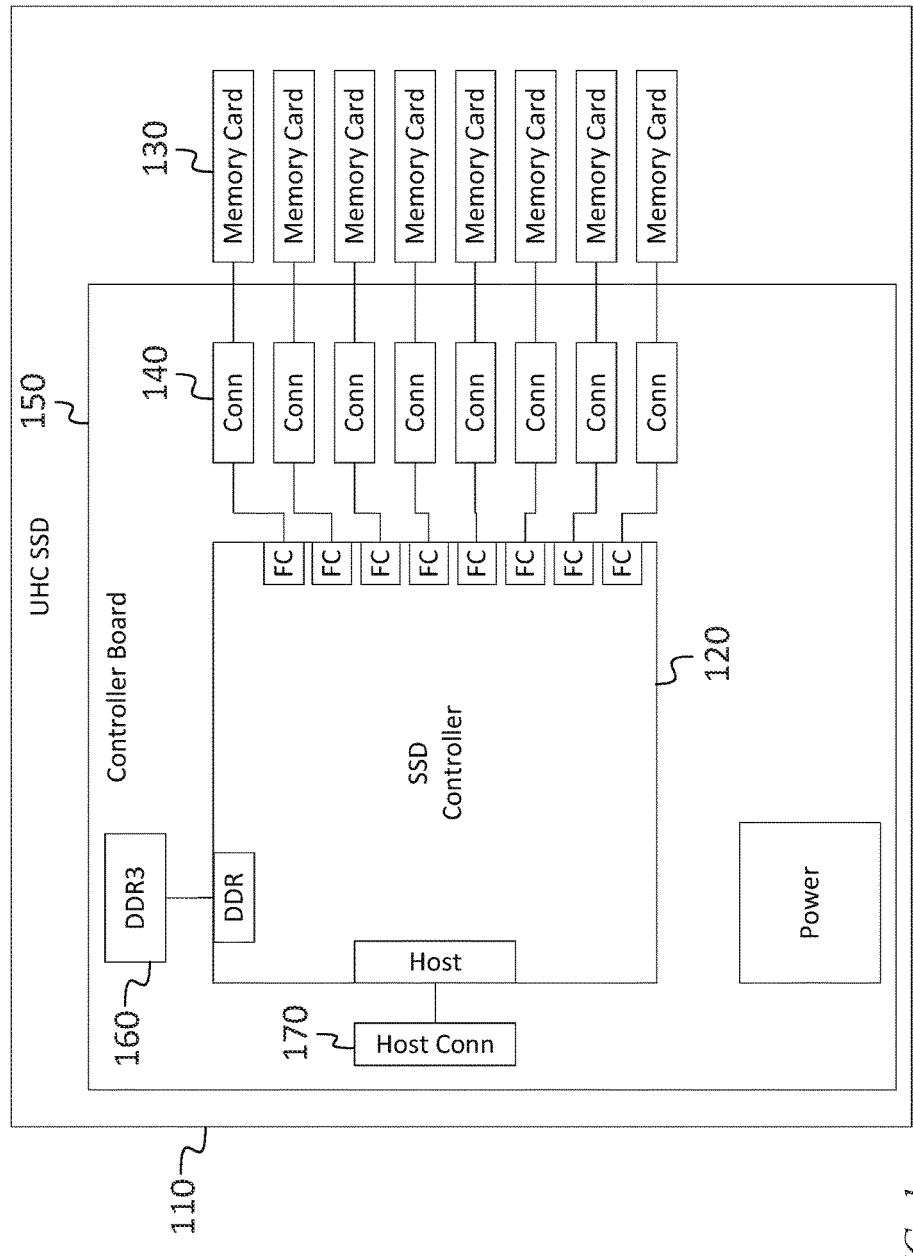
FIG. 1 is a block diagram of a solid state drive, according to an embodiment of the present invention.

Referring to FIG. 1, in one embodiment a solid state drive 110 includes a solid state drive controller 120 and a plurality of memory cards 130, each connected via a disconnectable connection 140 to a controller board 150, on which is installed the solid state drive controller 120. Each connection 140 may include a connector plug and a connector socket, described in further detail below. The solid state drive controller 120 may be a processing circuit, i.e., a circuit configured to process data or digital signals, described in further detail below. The controller board 150 may also include buffer memory 160 (e.g., DDR3 memory), components for providing power, and a host connector 170 that is part of a host interface through which the solid state drive 110 may be connected to a host, e.g., a server. FIG. 1 shows only 8 flash channel (FC) interfaces on the solid state drive controller 120, 8 memory card connections 140, and 8 memory cards 130; in some embodiments the number of each of these parts is greater or smaller, e.g., in some embodiments there are 16, 20, 24, 32 or more of each.

The solid state drive 110 may, in operation, be connected to, and provide storage for, a host, e.g., a server or other computer. The host interface (including the host connector, and the communications protocols) between the solid state drive 110 and the host may be, for example, a storage interface such as Serial Advanced Technology Attachment (SATA), Fibre Channel, Small Computer System Interface (SCSI), Serial Attached SCSI (SAS), Peripheral Component Interconnect Express (PCIe), Non Volatile Memory Express (NVMe), SCSI over PCIe, or a more general-purpose interface such as Ethernet or Universal Serial Bus (USB).

Figure 2A:
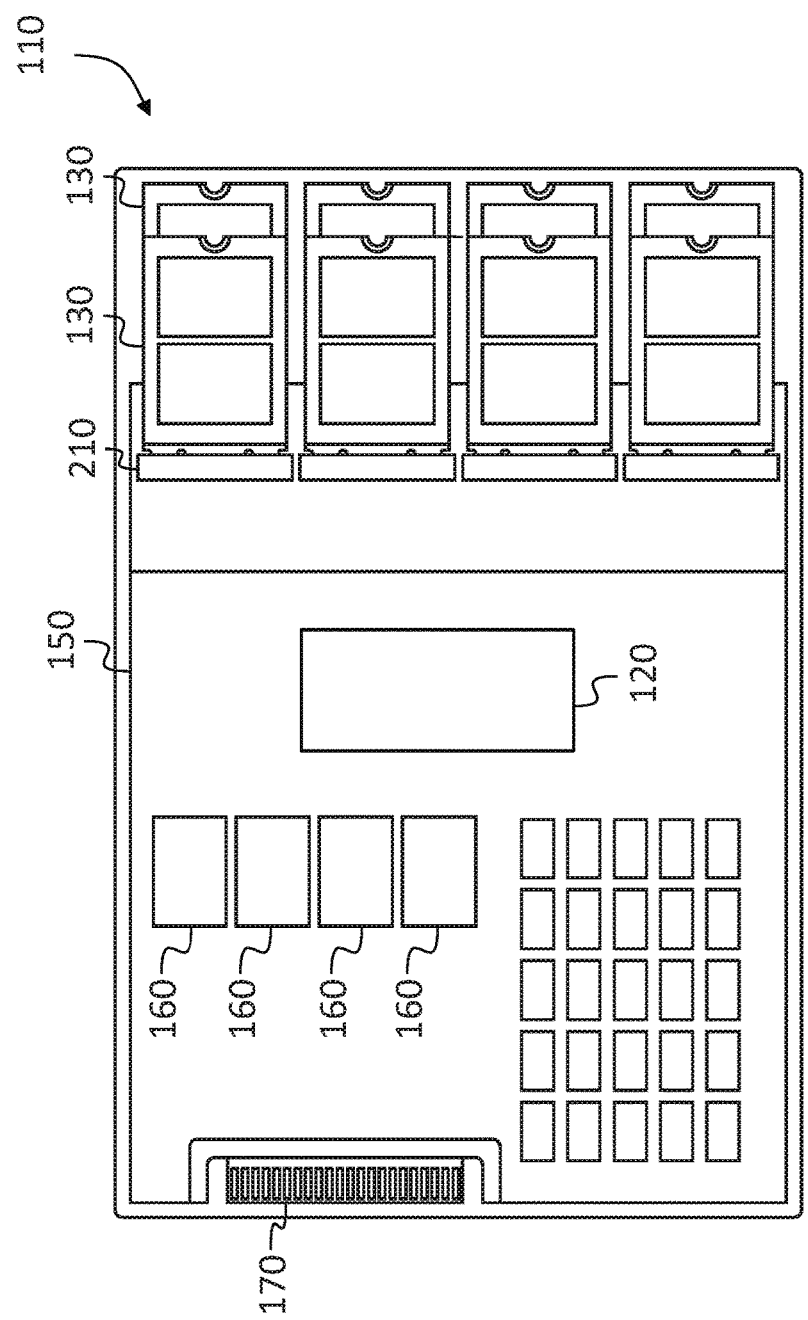
FIG. 2A is a plan view of a solid state drive, according to an embodiment of the present invention.

Referring to FIG. 2A, in some embodiments, the solid state drive 110 includes 16 memory cards, arranged in stacks of four rows of four cards each, in a 3.5 inch hard drive form-factor (or "large form factor" (LFF)). Such an embodiment may have a 26.1 mm height and may utilize an SFF-8639 connector as the host connector 170, which may make it suitable for replacing hard disk drives (HDDs) in cold storage applications. In some embodiments, mentioned above, there may be more or fewer memory cards, and they may be arranged differently, e.g., in a stack of three rows of four cards, or in a stack of four rows of three cards, or the like. Using the small form factor (SFF) standard, a dual-port solution may be realized to increase the overall system reliability and availability. For example dual port may include the ability to provide two independent paths from the host to the storage, such that (i) on a fail-over situation, the media may still be accessed (active-passive) or (ii) there are two independent ports to the media (active-active) allowing two separate host connections on the same physical connector. Dual port may be available to both SFF and LFF devices.

Figure 2B:
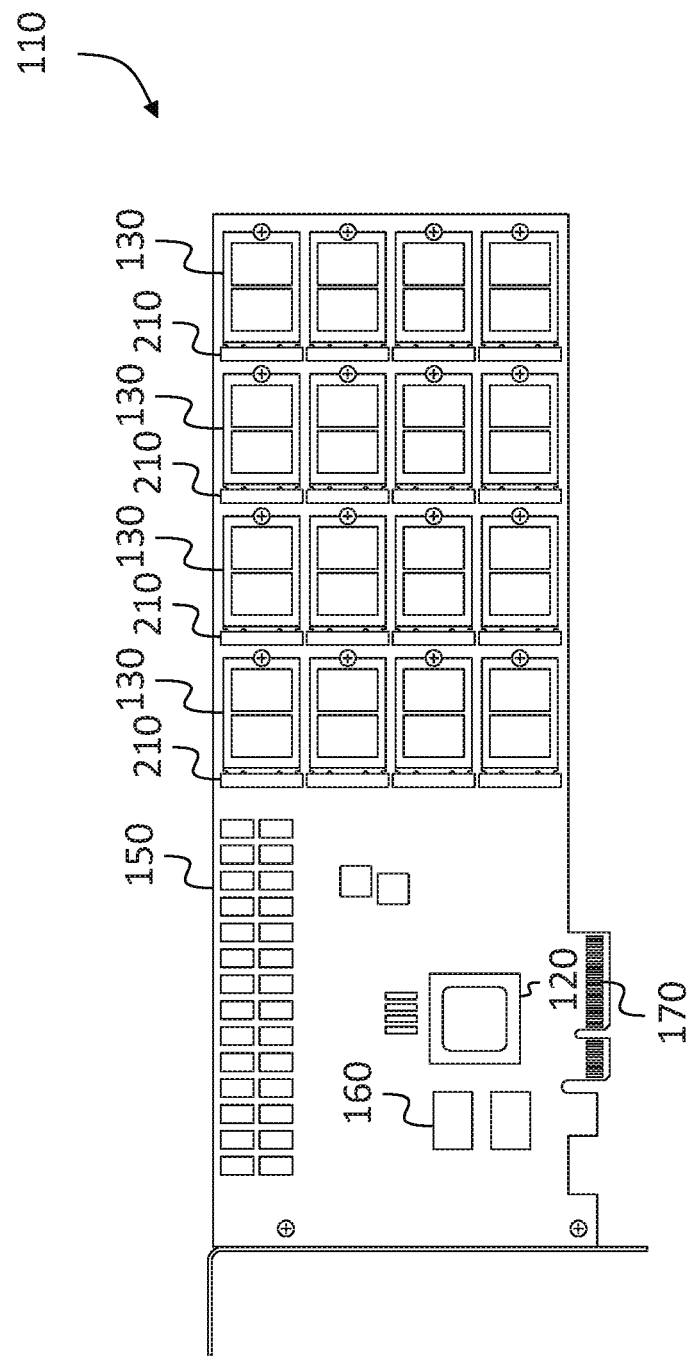
FIG. 2B is a plan view of a solid state drive, according to an embodiment of the present invention.

Referring to FIG. 2B, other embodiments may use a standard PCIe card form factor, with 16 memory cards, arranged e.g., in four rows of four cards each on a PCIe card or for example in the full-height, full length (FH-FL) card outline for super high capacity solutions. Other instantiations and moderate capacity solutions might be realized in shorter full-height, half length (FH-HL) outlines, or in other PCIe card formats.

In each of the above-identified form factors, each of the memory cards 130 may be coupled with, and supported at one end by, a card-edge connector socket 210, which may form one part of each of the memory card connection 140. Each of the memory cards 130 may also be secured and supported at the other end by a threaded fastener.

The storage medium used in some embodiments may be current and next generation flash (e.g., NAND electrically erasable programmable read only memory (EEPROM)) devices compliant with the Open NAND Flash Interface (ONFI) and Toggle interface standards or other similar or future non volatile memory (NVM) technology. The devices may be high density, block addressable and erasable elements suitable for block storage applications.

Figure 3A:
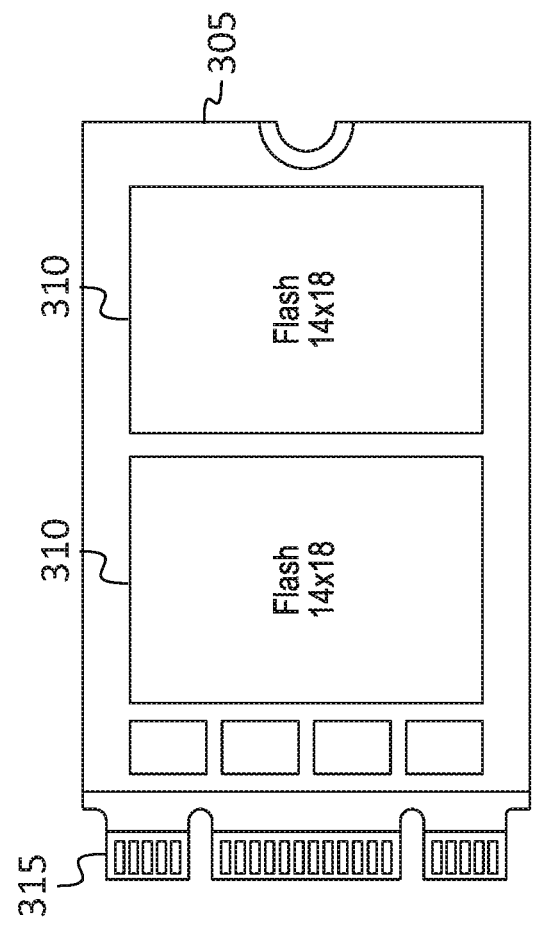
FIG. 3A is a bottom plan view of a memory card, according to an embodiment of the present invention.
Figure 3B:
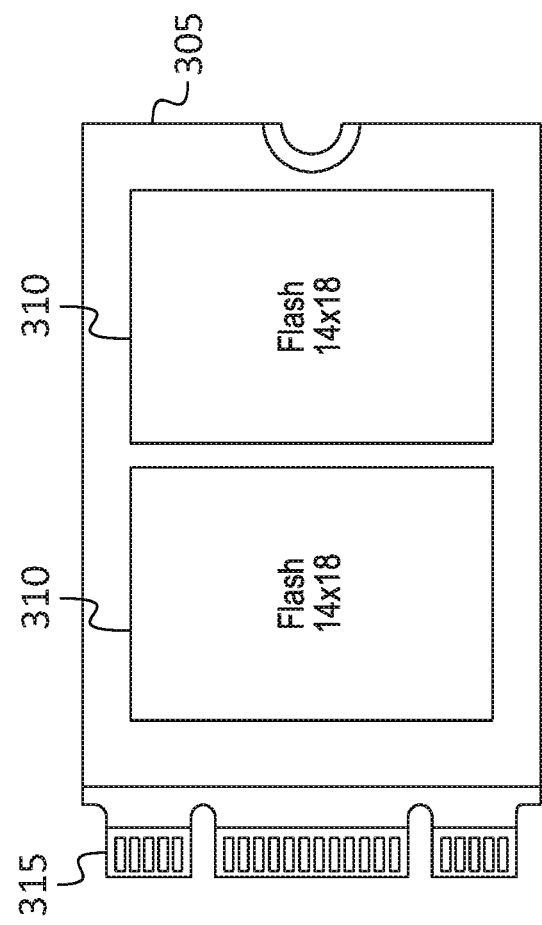
FIG. 3B is a top plan view of a memory card, according to an embodiment of the present invention.

Referring to FIGS. 3A-B, in one embodiment, each memory card is a printed circuit board 305 with two memory chips or "memory packages" or "memory components" 310 on one side of the printed circuit board and two memory packages 310 on the other side of the printed circuit board. Each memory package 310 may include sixteen flash memory die, i.e., sixteen semiconductor chips on each of which a quantity of flash memory has been fabricated. Each package may have a total capacity of one terabyte (TB). Each memory card may have, at one end of the memory card, a card-edge interface including a card-edge connector plug 315 that may have a physical configuration compatible with an industry-standard connector e.g., it may have an M.2-compliant card-edge connector plug 315. In particular, the edge of each of the memory cards 130 may have a pattern of conductors perpendicular to the edge, forming a card-edge connector plug 315, which may be configured to couple with a card-edge connector socket 210 (FIGS. 2A-2B).

Figure 4:
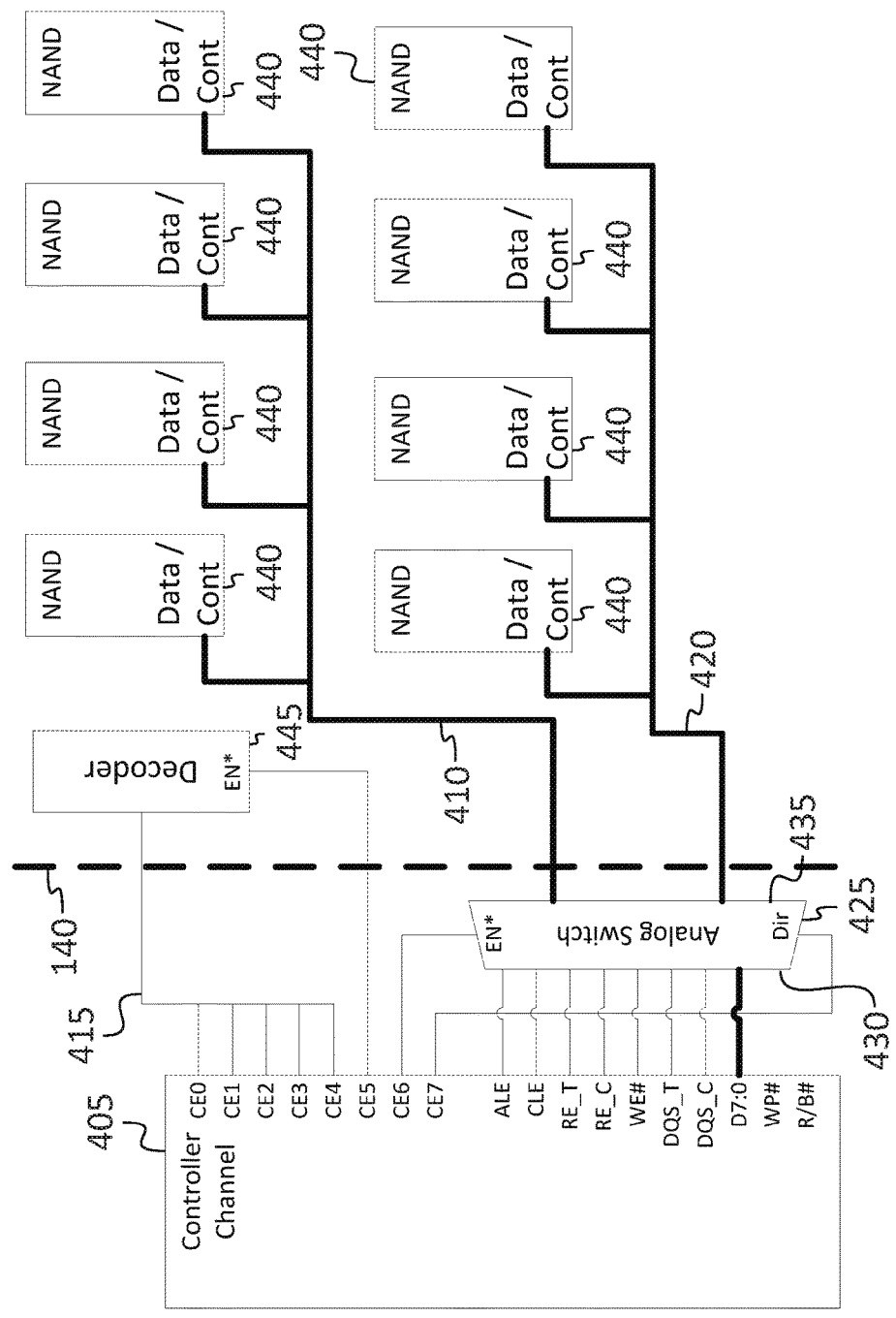
FIG. 4 is a block diagram of a portion of a solid state drive, according to an embodiment of the present invention.

Referring to FIG. 4, in some embodiments, each flash channel interface 405 (of the flash channel interfaces labeled "FC" in FIG. 1) on the solid state drive controller 120 may be connected to a plurality of flash memory die, through the memory card connection 140, by a first data and control bus 410, a second data and control bus 420, and a plurality of binary-encoded chip enable lines 415. The data and control lines of the flash channel interface at the solid state drive controller 120 may be multiplexed onto a first data and control bus 410, and the second data and control bus 420 by an analog switch. The analog switch 425 may include a plurality of pairs of field effect transistors, each pair being configured as a single-pole double-throw switch, with the common terminal being connected to a first side 430 of the analog switch 425, and each of the other two terminals being connected to a second side 435 of the analog switch. All of the switches in the analog switch 425 may be controlled by a signal (e.g., CE6, the seventh chip enable signal, counting from 0) from the flash channel interface. Accordingly, the pins of the flash channel interface of the solid state drive controller 120 may be connected to only the first data and control bus 410 or to the second data and control bus 420 at any given time, and the loading of the flash channel interface of the solid state drive controller 120 may be lower than it would be if it were connected to both the first data and control bus 410 and the second data and control bus 420 simultaneously. In some embodiments, the die load is further reduced by incorporating additional switches and using available control signals to manage the enables.

Each memory package 310 may include two die groups 440, each with a respective control and data bus connection on the package 310. Accordingly, a memory card 130 with four memory packages 310 may include eight die groups 440, as illustrated in FIG. 4. Each of the die groups 440 may include 8 flash memory die. Thus, each of the die groups 440 of FIG. 4 may share a memory package 310 with another die group (either with another die group connected to the same data and control bus or to a die group connected to a different data and control bus). The five chip enable pins CE0-CE4 connected to the decoder 445 may be driven with a 5-bit binary value which may be decoded by the decoder 445 to form 32 decoded chip enable signals, carried by 8 four-bit busses (not shown in FIG. 4), each four-bit bus connected to a respective die group 440. The 8 flash memory die in each die group 430 may then each be connected to one of the four chip enable signals received by the die group 430, with each chip enable signal being shared by two flash memory die in the die group 430. When any of the chip enables is asserted, only one of the pair of flash memory die sharing the chip is activated, depending on the value of the most significant address bit. This method of sharing a chip enable signal may be referred to as logical unit number (LUN) control. In some embodiments, up to 4 die are connected to a single chip enable signal, in what may be referred to as LUNs, and the additional decode may come from upper address lines. The decoder 445 may have an enable input connected to a chip enable output (e.g., the $6^{th}$ chip enable output, counting from 0, as illustrated in FIG. 4) of the flash channel interface 405, so that the solid state drive controller 120 may deassert all of the chip enable outputs of the decoder 445, causing all of the flash memory die in each of the memory packages 310 to operate in a low-power standby mode.

Figure 5B:
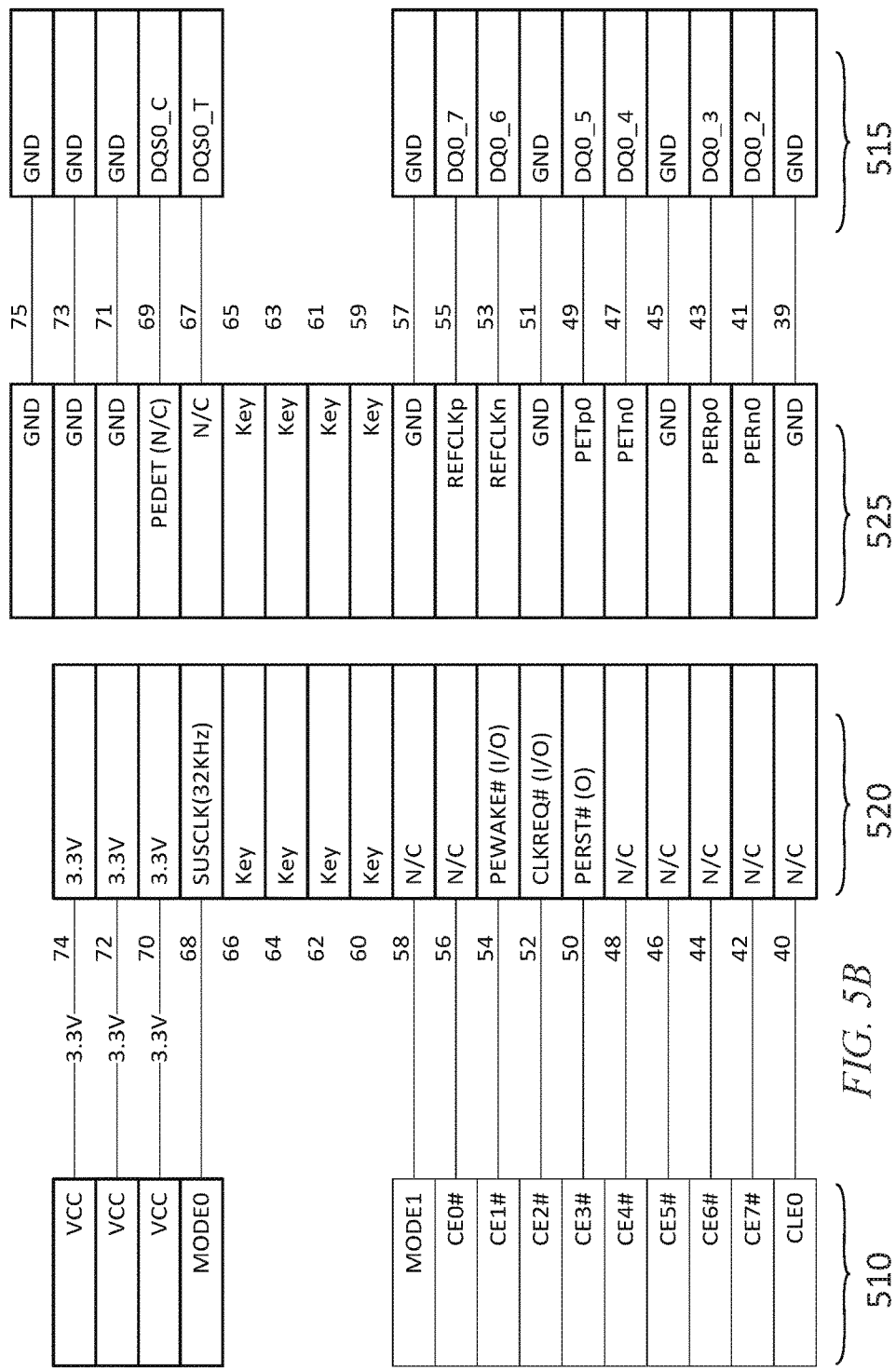
FIG. 5B is a pinout diagram of a second portion of a connector, according to an embodiment of the present invention.

Referring to FIGS. 5A-5B, in some embodiments, the memory card connection 140 (FIG. 1) employed to connect each of the memory cards 130 to the controller board 150 includes a card-edge connector socket 210 (FIGS. 2A-2B) and a card-edge connector plug 315 (FIGS. 3A-3B) both conforming to the M.2 connector standard (formerly referred to as a Next Generation Form Factor (NGFF) connector standard). Each conductor of the edge connector socket 210 or of the card-edge connector plug 315 is referred to as a "pin" of the connector although the term "pin" may not be descriptive of its shape. The functions of some of the conductors are modified from those specified by the M.2 interface standard, which contemplates the use of the connector as a connector for a PCIe or NVMe interface. The outer two columns 510, 515 of FIG. 5A show the function each conductor has, in this embodiment. The inner two columns 520, 525 show the function each pin may have in some related art configurations conforming to the M.2 standard. Certain conductors, e.g., pins 5 and 7, that are, in the M.2 standard, defined to carry high-speed differential signals (e.g., PERp3 and PERn3) are utilized, in some embodiments, to carry instead lower-speed single-ended signals (e.g., for pins 5 and 7, the DQ1_0 and DQ1_1 signals). Certain conductors (e.g., even-numbered pins between 40 and 48) may be (as illustrated in FIG. 5B) unused ("N/C") by the M.2 standard but utilized in some embodiments of the present invention, e.g., for chip enable signals.

The nomenclature of FIG. 5A may be interpreted according to the Open NAND Flash Interface specification (e.g., version 3.2 of this specification, available at www.onfi.org/specifications). For example, the DQ signals may be bits of an input-output port for transferring address, command, and data to and from the flash memory die, VCCQ may be the power supply for input and/or output signals, the RDY/BSY signals may indicate the target status, WP may be a Write Protect signal that disables flash array program and erase operations, VPP may be an optional external high voltage power supply to the memory card (which, if present, may make it unnecessary for the flash memory die to operate their internal charge pumps), the differential pair of signals RE0#_T and RE0#_C (and similarly the differential pair of signals RE1#_T and RE1#_C) may be Read Enable signals (Read Enable True and Read Enable Complement) that enable serial data output, WE may be a Write Enable signal that controls the latching of commands, addresses and data, ALE may be an Address Latch Enable signal, one of the signals used by the host to indicate the type of bus cycle (command, address, data), CLE may be a Command Latch Enable signal, one of the signals used by the host to indicate the type of bus cycle (command, address, data), CE may be a Chip Enable signal that selects the target, the differential pair of signals DQS0_T and DQS0_C (and similarly the differential pair of signals DQS1_T and DQS1_C) may be a Data Strobe signal that indicates the data valid window, and VCC may be the power supply to the memory card. MODE0 and MODE1 may be used to identify the type of memory card installed. In some embodiments these pins may be unused or they may be reserved so as to be available for functions to be defined in the future. In some embodiments, the signals of differential pairs of signals may utilize adjacent conductors (i.e., adjacent pins) in the memory card connection 140 to preserve signal integrity. The Toggle standard may have similar pin assignments.

In some embodiments, the controller board 150 is configured to provide power to the power conductors (i.e., the conductors that provide power to the memory cards 130) in a manner that reduces the likelihood of damage to an incompatible component inadvertently installed in one of the card-edge connector sockets 210. An incompatible component may be, for example, a standard M.2 storage device, i.e., a storage device designed to operate with conductors, at a card-edge connector socket, having functions corresponding to PCIe or NVMe at an M.2 interface. The likelihood of damage may be reduced by providing, at the power conductors, power at a voltage that is no higher than that which a standard M.2 device is designed to receive at the power conductors. For example, as shown in FIG. 5A, a standard M.2 storage device may be designed to receive, at pins 12 and 14 of the M.2 connector, DC power at a voltage of 3.3V. In some embodiments, the controller board 150 supplies power at a voltage of 1.8 V at both of these pins, so that if a standard M.2 storage device is inadvertently installed, it will be exposed to a lower voltage at these two pins than the voltage it is designed to tolerate, and as result the likelihood of damage to the standard M.2 storage device may be low. In these embodiments this characteristic of the pin configuration may also protect the solid state drive controller 120 from being exposed to unacceptable voltages at some of its pins. In some embodiments, the pins used for power are pins of the M.2 connector that are used for power within the M.2 standard (e.g., pins 2, 4, 12, 14, 16, 18, 70, 72, and 74) and the pins used for ground are pins of the M.2 connector that are used for ground within the M.2 standard (e.g., pins 1, 3, 9, 15, 21, 27, 33, 39, 45, 51, 57, 71, 73, and 75).

Further, the controller board 150 may be configured to provide power at a voltage of 12V at pins 16 and 18 of the M.2 connector, but to provide power at these two pins only after the controller board 150 has first established, by a suitable communication with the device installed in the card-edge connector socket 210 (e.g., writing some data to the device, reading back the data, and verifying that the data read back match the data written), that the device installed in the card-edge connector socket 210 can tolerate a voltage of 12V at these pins. As such, when a memory card 130 according to an embodiment of the present invention is installed in the card-edge connector socket 210, the power-up sequence may involve (i) the memory card 130 first being powered up by power supplied, e.g., over the VCC and/or VCCQ pins, (ii) the controller board 150 identifying the device as being a memory card 130 according to an embodiment of the present invention, and (iii) the controller board 150 furnishing power at a voltage of 12V at pins 16 and 18 to the memory card 130.

Figure 6:
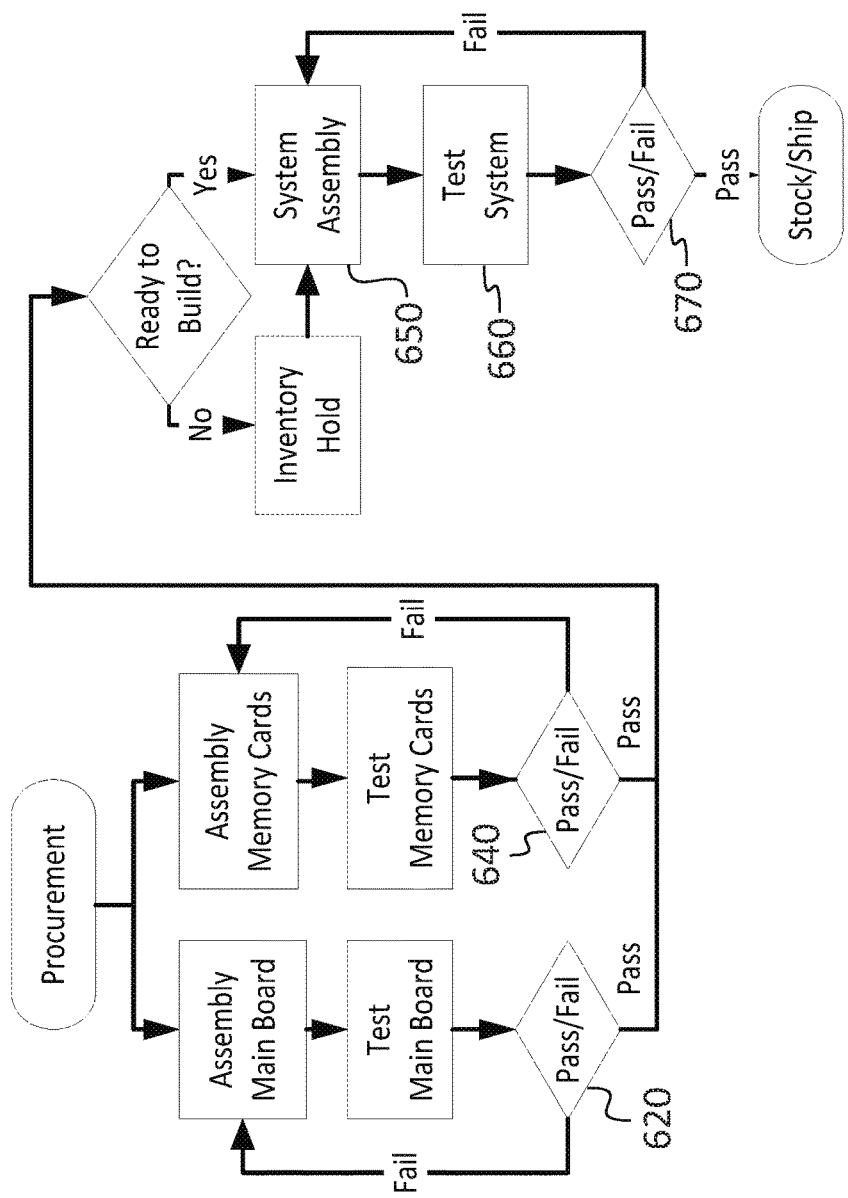
FIG. 6 is flow chart of a manufacturing process for a solid state drive, according to an embodiment of the present invention.

Referring to FIG. 6, in one embodiment assembly and testing of the controller board 150 and of the memory cards 130 may be done independently, prior to assembly. A failure of any of these parts in the assembly and test process may be addressed by substituting a good part for the defective part, thus avoiding (compared to an embodiment in which the memory cards cannot be easily removed from the controller board 150) a significant inventory charge that might otherwise occur if the entire solid state drive were held up during debug and repair. The flow chart outlines the assembly process. Each controller board 150 (or "main board") is assembled and then tested; the memory cards 130 are assembled and tested in parallel. In acts 620 and 640, the parts are either forwarded to a system assembly operation if the tests succeeded (i.e., if the parts passed their respective tests), or cycled back to a respective assembly operation (which may include rework operations) if they failed. When the system assembly operation is ready to build systems (e.g., solid state drives), parts are assembled in an act 650, the completed solid state drives are tested in an act 660, and sorted, in an act 670, into (i) systems that passed test and are to be shipped, and (ii) systems that failed and are to be reworked and retested.

Figure 7B:
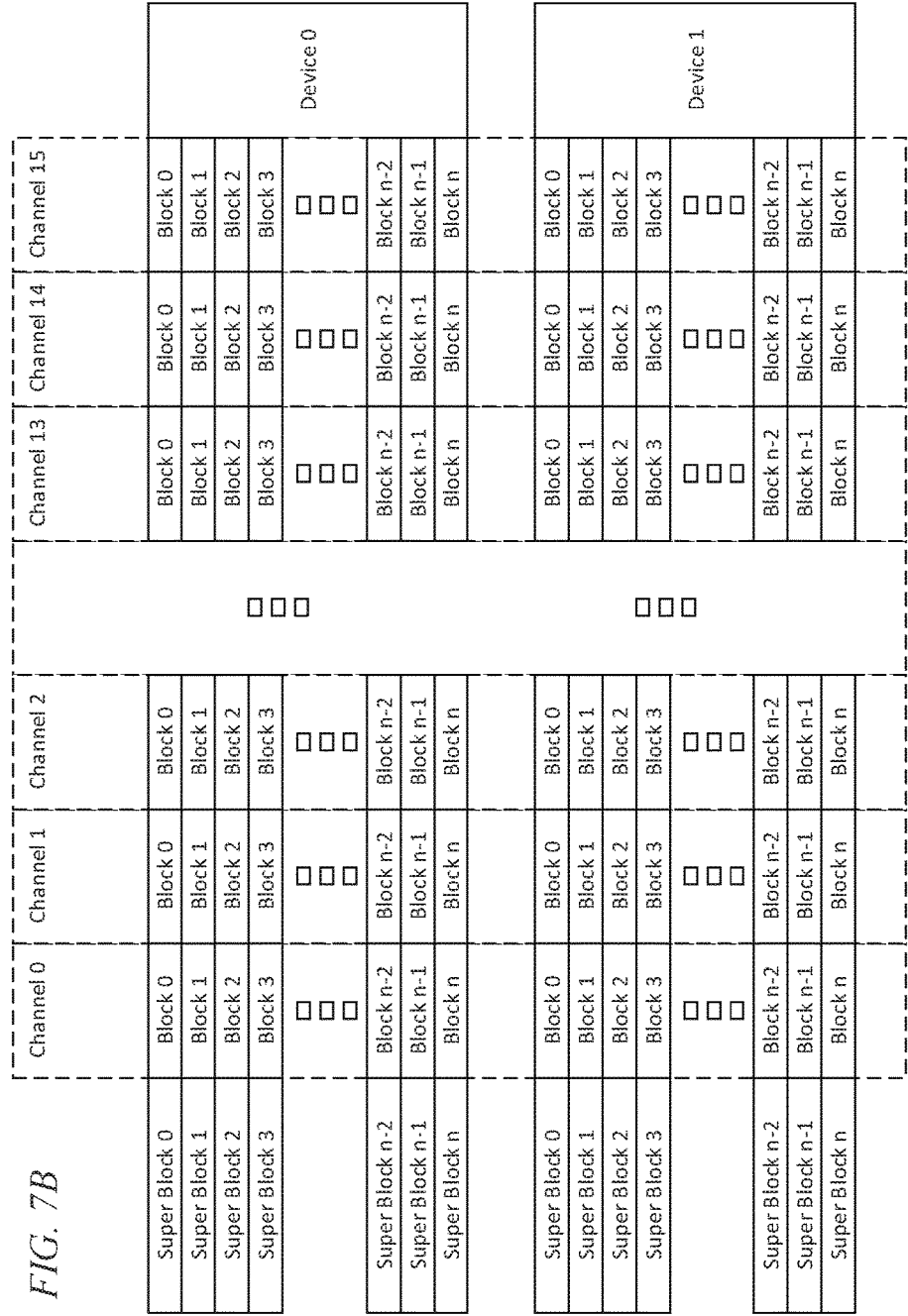
FIG. 7B is a memory layout diagram for a solid state drive, according to an embodiment of the present invention.

Referring to FIGS. 7A and 7B, redundant data may be stored in the solid state drive to allow it to recover from certain kinds of failures. For example, the data may be striped across all channels (e.g., across all 16 flash channels, in a solid state drive with 16 flash channels) in a regular manner. Further the system may provide a method of reconstructing all data that may be lost if a memory card fails. For example, one memory card may be configured to store error correction information, in the form of straight parity bits or other advanced error correcting code (ECC) algorithm, such as Reed-Solomon (RS) or low-density parity-check (LDPC). As data is stored on the media (e.g. in the flash memory), it is written in stripes to pages in every channel. Each page may be the smallest amount of date returned by a read operation (e.g., 2 k) and may be protected by a separate error correcting code. The collection of corresponding pages may be referred to as a super page; for example the combination of all of the first pages ("Page 1") from each of the 16 channels may form super page 1. In FIG. 7A, each super page may be a stripe. One page (e.g., the final page) of this super page (super page 1), e.g., the first page of channel 15, may store parity bits. If a failure or combination of errors occurs that cannot be corrected by the error correcting code in a single memory card (e.g., if the memory card 130 connected to channel 2, for example, becomes entirely inoperable), then the unavailable data may be reconstructed using the error correction information stored for the entirety of the stripe. If the error correction is enabled using straight parity, it can be reconstructed by calculating for any given bit location in channel 2 the value that would, in combination with the corresponding bit values in channels 0-1 and 3-14, yield the parity indicated by the corresponding parity bit stored in channel 15. Similarly, referring to FIG. 7B, in another embodiment, each stripe may be a block wide. A block may be the smallest erasable entity in a flash memory die.

Figure 8:
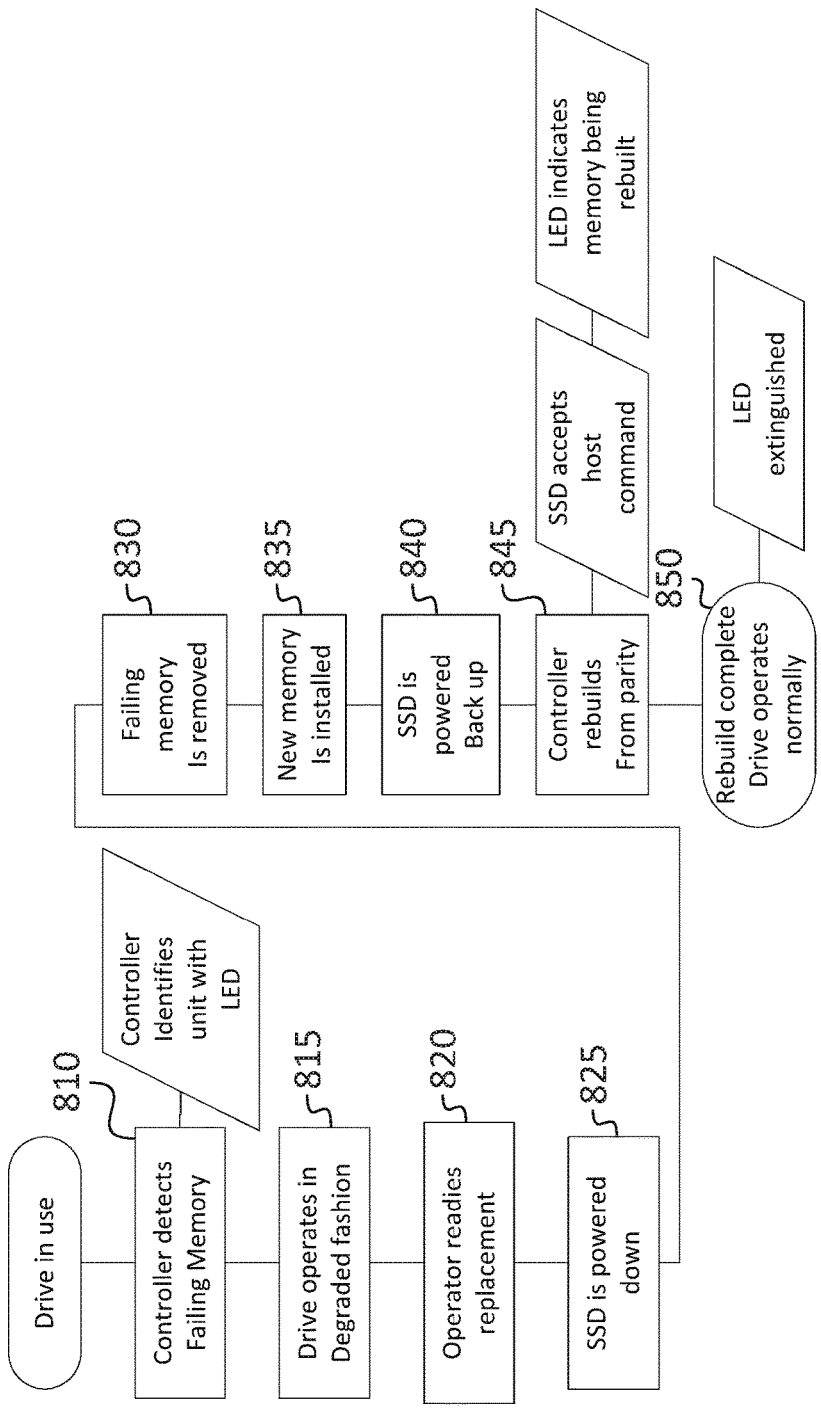
FIG. 8 is a flow chart of a process for restoring a solid state drive to full functionality after the failure of a memory card, according to an embodiment of the present invention.

Referring to FIG. 8, in some embodiments, the failure of one of the memory cards 130 may result in two periods of operation with degraded performance, and an outage of relatively short duration. When the memory card fails, the solid state drive controller may detect the failure in an act 810, and indicate to the operator, using a suitable light emitting diode, which card has failed. In some embodiments, in addition to or instead of illuminating a light emitting diode, the solid state drive controller may send an error message, identifying the failed memory card, to the host computer, and the error message may then be interpreted by the operator. The solid state drive may then continue to operate, in an act 815, at a degraded level of performance, reconstructing data previously stored in the inoperable memory card, as needed, from the parity information and from data in the other memory cards. An operator may then, in an act 820, ready a replacement memory card, power the solid state drive down in an act 825, remove the inoperable memory card in an act 830, install the replacement memory card in an act 835, and power the solid state drive back up in an act 840. Powering the solid state drive down for replacement of the memory card may avoid damage to the new memory card, because the M.2 connector may not be hot-swappable. Here, powering the solid state drive down may involve shutting down the host (e.g., if the solid state drive is a PCIe card solid state drive) or it may involve unplugging the solid state drive (to power down the solid state drive) if the solid state drive is connected to the host by a SFF-8639 or similar connector, which may provide a hot-swappable connection. The solid state drive controller may then, in an act 845, recreate the data previously stored in the inoperable memory card on the new memory card, from the parity information and from data in the other memory cards, during which time the drive may again operate at a degraded level of performance. During the act 845 the solid state drive may accept host commands and the solid state drive controller may indicate, with the light emitting diode (e.g., by driving it to be illuminated with a different color, or to flash) or by another method of notification to the host, that the data are being recreated on the new memory card. Once the new memory card contains the data previously stored in the inoperable memory card, the operation completes, in an act 850, and the light emitting diode may be extinguished and/or the host notified of the completed action.

In view of the foregoing, a solid state drive according to embodiments of the present invention may include a modular array of memory cards installed on a controller board, each memory card being connected to the controller board utilizing a respective connector. The memory cards may be individually tested during manufacturing, prior to assembly of the solid state drive, and the memory cards may be individually replaceable in case of failure. Redundant data, e.g., parity data, may be stored in the solid state drive, making it possible for a solid state drive controller on the controller board to restore the contents of a removed memory card (e.g., a memory card that has failed) on a replacement memory card installed in its place. The connector utilized to connect each memory card to the controller board may be an industry standard, commercial off the shelf connector, e.g., an M.2 connector; the functions of the conductors in the connector may be redefined, from the industry standard definitions, for the purposes of embodiments of the present invention.

The term "processing circuit" is used herein to include any combination of hardware, firmware, and software, employed to process data or digital signals. Processing circuit hardware may include, for example, application specific integrated circuits (ASICs), general purpose or special purpose central processing units (CPUs), digital signal processors (DSPs), graphics processing units (GPUs), and programmable logic devices such as field programmable gate arrays (FPGAs). In a processing circuit, as used herein, each function is performed either by hardware configured, i.e., hard-wired, to perform that function, or by more general purpose hardware, such as a CPU, configured to execute instructions stored in a non-transitory storage medium. A processing circuit may be fabricated on a single printed wiring board (PWB) or distributed over several interconnected PWBs. A processing circuit may contain other processing circuits; for example a processing circuit may include two processing circuits, an FPGA and a CPU, interconnected on a PWB.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "major component" means a component constituting at least half, by weight, of a composition, and the term "major portion", when applied to a plurality of items, means at least half of the items.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of an ultra high capacity solid state drive have been specifically described and illustrated herein, many modifications and variations will be apparent to those skilled in the art. Accordingly, it is to be understood that an ultra high capacity solid state drive constructed according to principles of this invention may be embodied other than as specifically described herein. The invention is also defined in the following claims, and equivalents thereof.

What is claimed is:

1. A solid state drive, comprising:
    a controller board, comprising a plurality of card-edge connector sockets; and
    a plurality of memory cards on the controller board,
    a first memory card of the plurality of memory cards comprising:
        a memory package comprising a flash memory die; and
        a first card-edge connector plug,
    the first card-edge connector plug being coupled to a first connector socket of the plurality of card-edge connector sockets,
    wherein the first connector socket is an M.2 connector socket having a plurality of pins, and
    wherein the controller board is configured to provide and/or receive, at a plurality of first bus pins of the pins of the M.2 connector socket, a plurality of signals compliant with an Open NAND Flash Interface (ONFI) standard or with a Toggle standard.

2. The solid state drive of claim 1, wherein the signals include:
    an address latch enable signal;
    a command latch enable signal;
    a differential pair of read enable signals;
    a write enable signal;
    a differential pair of data strobe signals; and
    eight input-output port bit signals.

3. The solid state drive of claim 2, wherein:
    the controller board is configured to provide and/or receive the differential pair of read enable signals on a pair of adjacent pins of the M.2 connector socket, and
    the controller board is configured to provide and/or receive the signals of the differential pair of data strobe signals on a pair of adjacent pins of the M.2 connector socket.

4. The solid state drive of claim 3, wherein the controller board further comprises a solid state drive controller, the solid state drive controller being a processing circuit and having a first flash channel interface, and configured to provide and/or receive, at a plurality of first flash channel pins of the solid state drive controller, a plurality of signals compliant with an Open NAND Flash Interface (ONFI) standard or with a Toggle standard.

5. The solid state drive of claim 4, wherein the controller board further comprises an analog switch configured to selectively connect the first flash channel pins:
    to the first bus pins of the M.2 connector socket, or
    to a plurality of second bus pins of the pins of the M.2 connector socket.

6. A solid state drive, comprising:
    a controller board, comprising a plurality of card-edge connector sockets; and
    a plurality of memory cards on the controller board,
    a first memory card of the plurality of memory cards comprising:
        a memory package comprising a flash memory die; and
        a first card-edge connector plug,
    the first card-edge connector plug being coupled to a first connector socket of the plurality of card-edge connector sockets,
    wherein the first connector socket is an M.2 connector socket having a plurality of pins, and
    wherein the solid state drive further comprises a solid state drive controller on the controller board, the solid state drive controller being configured to communicate with the first memory card only through the M.2 connector socket and to provide and/or receive, at a plurality of first bus pins of the pins of the M.2 connector socket, a plurality of signals compliant with an Open NAND Flash Interface (ONFI) standard or with a Toggle standard, wherein the signals include:
an address latch enable signal;
a command latch enable signal;
a differential pair of read enable signals;
a write enable signal;
a differential pair of data strobe signals; and
eight input-output port bit signals.

* * * * *